United States Patent
Foster et al.

(10) Patent No.: US 7,897,503 B2
(45) Date of Patent: Mar. 1, 2011

(54) INFINITELY STACKABLE INTERCONNECT DEVICE AND METHOD

(75) Inventors: Ron B. Foster, Fayetteville, AR (US);
Ajay P. Malshe, Fayetteville, AR (US);
Matthew W. Kelley, Fayetteville, AR (US)

(73) Assignee: The Board of Trustees of the University of Arkansas, Little Rock, AR (US)

(*) Notice: Subject to any disclaimer, the term of this patent is extended or adjusted under 35 U.S.C. 154(b) by 108 days.

(21) Appl. No.: 11/920,308

(22) PCT Filed: May 12, 2006

(86) PCT No.: PCT/US2006/018442
§ 371 (c)(1),
(2), (4) Date: Apr. 7, 2009

(87) PCT Pub. No.: WO2006/124597
PCT Pub. Date: Nov. 23, 2006

(65) Prior Publication Data
US 2009/0212407 A1    Aug. 27, 2009

Related U.S. Application Data

(60) Provisional application No. 60/680,994, filed on May 12, 2005.

(51) Int. Cl.
*H01L 21/4763* (2006.01)

(52) U.S. Cl. .................. 438/618; 438/106; 438/712; 257/E21.17; 257/E21.218; 257/E21.245; 257/E21.278; 257/E21.324; 257/E21.499

(58) Field of Classification Search ............... 438/106, 438/618, 605, 612, 613, 617, 712, 723, 680, 438/752, 753; 257/E21.17, 218, 245, 278, 257/324, 499
See application file for complete search history.

(56) References Cited

U.S. PATENT DOCUMENTS

| | | | |
|---|---|---|---|
| 5,193,738 A | 3/1993 | Hayes | |
| 6,020,629 A | 2/2000 | Farnworth et al. | |
| 6,097,087 A | 8/2000 | Farnworth et al. | |
| 6,107,109 A * | 8/2000 | Akram et al. | 438/15 |
| 6,114,187 A | 9/2000 | Hayes | |
| 6,235,554 B1 * | 5/2001 | Akram et al. | 438/109 |
| 6,452,238 B1 | 9/2002 | Orcutt et al. | |
| 6,465,281 B1 | 10/2002 | Xu et al. | |
| 6,534,340 B1 | 3/2003 | Karpman et al. | |
| 6,638,784 B2 | 10/2003 | Bartlett et al. | |
| 6,656,768 B2 | 12/2003 | Thomas | |

(Continued)

OTHER PUBLICATIONS

Anthony, T.R., "forming Electrical Interconnections through Semiconductor Wafers," J. Appl. Phys., vol. 52, No. 8, Aug. 1981, pp. 5340-5349.

*Primary Examiner*—David Nhu
(74) *Attorney, Agent, or Firm*—J. Charles Dougherty

(57) ABSTRACT

A device having the capability for electrical, thermal, optical, and fluidic interconnections to various layers. Through-substrate vias in the interconnect device are filled to enable electrical and thermal connection or optionally hermetically sealed relative to other surfaces to enable fluidic or optical connection. Optionally, optical components may be placed within the via region in order to manipulate optical signals. Redistribution of electrical interconnection is accomplished on both top and bottom surfaces of the substrate of the interconnect chip.

14 Claims, 10 Drawing Sheets

U.S. PATENT DOCUMENTS

| | | |
|---|---|---|
| 6,806,557 B2 | 10/2004 | Ding |
| 6,828,674 B2 | 12/2004 | Karpman |
| 6,846,725 B2 * | 1/2005 | Nagarajan et al. ........... 438/456 |
| 7,019,408 B2 | 3/2006 | Bolken et al. |
| 2002/0089044 A1 | 7/2002 | Simmons et al. |
| 2002/0090749 A1 | 7/2002 | Simmons |
| 2002/0113296 A1 | 8/2002 | Cho et al. |
| 2003/0160021 A1 | 8/2003 | Platt et al. |
| 2003/0160310 A1 | 8/2003 | Langhorn |
| 2004/0021210 A1 | 2/2004 | Hosomi |
| 2004/0088855 A1 | 5/2004 | Akram |
| 2006/0113653 A1 | 6/2006 | Xiaoqi et al. |
| 2006/0175696 A1 | 8/2006 | Kim |

* cited by examiner thin starting substrate to 25 -100 microns thermally oxidize both sides of wafer attach to temporary support substrate deposit, pattern and etch interconnect metal pattern and etch silicon dioxide pattern and RIE etch vias insulate via sidewalls liftoff via insulation material deposit, pattern and etch via liner metal unpatterned RIE etch cavities demount, invert wafer and remount deposit, pattern and etch metal demount, dice and pick-and-place

FIGURE 11

INFINITELY STACKABLE INTERCONNECT DEVICE AND METHOD

This application is the National Stage of International Application No. PCT/US2006/018442, filed 12 May 2006, which claims the benefit of U.S. Provisional Application No. 60/680,994, filed 12 May 2005, both of which are incorporated herein by reference.

TECHNICAL FIELD

This invention relates generally to interconnection and packaging of semiconductor dice and specifically to a capping chip which may be placed on a previously fabricated device wafer, such as an integrated circuit or Micro-Electro-Mechanical Systems (MEMS) wafer. In a preferred embodiment the capping chip may be placed on a fully fabricated device wafer prior to dicing of said wafer, and may be heated appropriately to form a multiplicity of permanent electrical and mechanical connections. Electrical, optical, fluidic and thermal through-connections may be prepared on the multifunctional capping chip to enable interconnection between an underlying device chip and a second device chip, circuit chip or circuit board. The capping chip is flexible to accommodate either land grid array or ball grid array interconnections between a previously fabricated chip and a second previously fabricated chip or circuit board. The capping chip may incorporate recesses which can further accommodate MEMS or sensitive materials in an enclosed cavity. During assembly of the capping chip to a device chip, the ambient trapped in the enclosed cavity may be controlled to include at least vacuum, inert gases, reactive gases other than air, or air.

The invention may be applied in wafer-level and chip-scale packaging with provision for electrical, optical, fluidic and thermal through-substrate vias. The invention in particular accommodates wafer-level packaging of devices containing biological or chemical sensors, optically active components, microfluidic and MEMS.

BACKGROUND ART

Many electronic devices are fabricated in wafer form. For example, integrated circuits, sensor, light emitting diodes, and low temperature co-fired ceramic (LTCC) devices are fabricated in wafer form. Following fabrication, functional devices are typically singulated and then separately packaged.

Singulated semiconductor dice, oftentimes called chips, require individual packaging in order to both firmly attach the dice and provide for electrical and thermal interconnection. The format is generally referred to as a first level of packaging that is required to convert from very small interconnections to larger ones that are capable of being in turn connected to a system for power and signal distribution to the die. Such first-level packages may also be useful for testing functionality of the die prior to further connecting to a system.

The packaging steps include at least provision for a permanent substrate, often called a header; interconnection, typically by wire bonding or flip-chip method; and encapsulation by overmolding or lid attachment. The header often contains further provision for electrical and thermal connection to a circuit board. It is commonly recognized that steps involving handling of individual devices in chip form are much more expensive than steps that are completed in wafer form. This is due to the relative difficulty and time consuming steps involved in separately handling singulated chips. A method is sought that enables encapsulation of devices in wafer form, prior to singulation, while simultaneously providing for flexible interconnection to other chips or boards.

The trend is towards a so-called "chip scale package", where the dimensions of the package surrounding the semiconductor dice are comparable to those of the dice itself. For example, the lateral dimensions of the package may be no more than 1.2 times that of the dice. The drivers for chip-scale packaging are both to reduce overall system cost and volume.

Most typically, a chip scale package includes a substrate to which the dice is bonded, and allowance for wire-bonding connections between the dice and the substrate. In a common variation termed as flip-chip, the semiconductor dice termination pads are prepared for simultaneous mechanical and electrical interconnection to a substrate. The dice is inverted onto a substrate having matching pads and the electrical and mechanical connections are accomplished. For example, the interconnection medium may be solder or electrically-conductive epoxy. Ideally, such flip-chip interconnection may allow for solder balls arranged in a dense array, termed a ball grid array (BGA). Such arrays may allow for hundreds or thousands of electrical and thermal interconnections to be simultaneously.

In the pursuit of reduced cost and size of electronics systems, a clear direction for development is 3D. Chip stacking is becoming an increasingly important way to reduce volumes. It is highly desirable to extend interconnection of semiconductor dice vertically without limit. That is, one dice is attached above a second, and so on to form a 3-D stack. Many workers have proposed various methods for accomplishing such stacking. However, no generalized method allowing for unlimited number of dice to be stacked to form a complete system has been proposed.

However, new challenges arise with 3D chip stacking, including requirements for chip-to-chip interconnect. A particular problem that must be addressed with vertically stacked semiconductor dice is that of heat dissipation. As overall system volumes are dramatically reduced by stacking various subsystems in close proximity, the heat dissipation requirements escalate. In fact, normal conductive or air convection methods of heat dissipation may be limiting. To be widely useful, an infinitely stackable device and method must include provision for heat dissipation by conduction to a liquid. This leads to the conclusion that such an interconnection device and method must allow for fluidic connections, as well as electrical connections.

As semiconductor dice clock speeds are steadily increased, limitations on signal propagation are being approached. Electrical signal propagation is limited by parasitic resistances and capacitances, with associated "RC delay times". While there are challenges to be overcome in converting back-and-forth from electrical to optical domain, there are clear advantages for signal propagation. Therefore, a generalized solution for stackable dice should include capability for optical signal propagation. Additionally, the maximum distance that a signal must propagate within a subsystem is proportional to the diagonal of the dice itself. It is desirable to reduce this distance. If the same subsystem normally constructed on a single dice in a 2-D plane were divided into much smaller components and stacked to form an interconnected 3-D system, the maximum distance that a signal must propagate within the subsystem is then proportional to the diagonal of the cube so formed. Another opportunity is to combine multiple subsystems into a fully interconnected system, thereby providing further improvements in signal propagation delay.

A new solution must enable easily partitioning of functionality such that integrated circuits or Micro-Electro-Mechanical Systems (MEMS) devices prepared on silicon, glass, ceramic or semiconductor substrates can be interconnected and packaged with minimal interference or interaction between the device wafer fabrication and the packaging approach. Such partitioning will ideally allow for the initial packaging enclosure to be placed over a device in the same clean room where the devices are manufactured. In this manner, such initial packaging can be completed almost immediately following preparation of the devices in their most sensitive state (i.e. MEMS release, or deposition of sensitive materials). No good solution to these problems has been developed to date.

Both performance and reliability of the subject devices depends intimately on the ability to flexibly customize all packaging materials to be compatible with the enclosed devices. For example, accelerometers, gyros and pressure sensors require that coupling of parasitic stresses from the package be minimized, which in turn requires that all materials have close match in coefficient of thermal expansion and low creep. Depending on the materials used in construction of the device, this requirement might in turn create a demand that packaging materials be constructed of ceramic, glass, silicon, silicon carbide or III-V semiconductor. In addition, the need for good thermal management may lead to a requirement for high thermal conductivity materials; or high frequency devices may require ultra-low loss dielectrics. Clearly, a packaging approach that enables a variety of materials to be flexibly interchanged is highly desirable.

Many miniature devices requiring packaging involve sensitive components, such as moveable elements, or materials that may degrade by exposure to ordinary atmospheric conditions. For example, MEMS devices involve the integration of elements such as accelerometers, gyros, RF switches on a common silicon substrate. Microelectronics fabrication procedures result in such device being released as a final process step. Ideally, these devices should be immediately protected from dust or from chemical contamination in order to ensure long-term viability. In other applications, biological materials may be placed in a prepared cavity on a wafer, and these materials should be sealed to prevent oxidation or chemical contamination. In both cases, it is desirable to seal the device in a cavity with a controlled ambient ranging from vacuum to controllably reactive gases to inert gases. In each case, the packaged devices may become components of a comprehensive systems-on-a-chip (SOAC) strategy. With the constant demand for reduced cost and size of systems, along with higher reliability, such SOAC approaches are gaining increasing interest.

The miniaturization of mechanical systems promises new directions in science and technology. The major markets for MEMS are in optical communications, biotechnology, automotive industry, and radio frequency (RF) applications. MEMS sensors and actuators are commonplace in automobiles to replace existing devices with improved performance, reduced cost, and better reliability. The rapid increase of MEMS applications requires a more thorough study of MEMS packaging. One of the challenges that MEMS packaging faces is that the environments in which MEMS devices operate can vary dramatically with each application.

Applications of MEMS-based devices encompass a vast spectrum of sciences and technologies. Common MEMS applications comprise sensors for temperature, pressure, flow rate, humidity, and chemical and medical applications; uses in fluidics such as pumps dispensers, flow-meters, and valves; inertial devices such as accelerometers, position sensors, and gyroscopes; actuators of all types including rotators, steppers, drivers, and positioners; optical devices such as mirrors, lenses, gratings, filters, choppers, detectors, switches, and wave guides; and thermal management devices such as heaters, cooling devices, and heat pipes. Furthermore, these individual devices can be integrated into one package or system to perform a myriad of operations in a compact package. Nevertheless, MEMS can be broken down into several classifications by industry: automotive, military/aerospace, biological, optical, and telecommunications.

MEMS are not limited to purely mechanical and electrical systems, but also have many uses when tapping into the area of optics. This branch of MEMS is known as micro-electro-optical-mechanical systems (MOEMS). MOEMS consist mostly of optical switches for communications. MOEMS make possible high speed switching without the conversion of optical signals to electrical and back to optical. The backbones of the Internet are primarily optical systems that consist of fiber-optic cables that connect continents, major cities, and large technical centers.

In the field of high frequency communications, radio frequency (RF) MEMS has enabled increasingly smaller and more portable communications products. RF MEMS switches can be used as phase shifters for use in beam steering in electronically steerable radar arrays. Another application is the use in tunable filters and tunable matching networks. A considerable size reduction can be gained by replacing a switched filter bank with a discretely tunable filter, in which switches may be embedded into the filter network directly. This changes the lumped element reactances or transmission line resonators that create the filter response. Furthermore, multifunctional capability—i.e. to transmit and receive in different bands or to have concurrent communications and radar functions—is increasing in demand for microwave systems. RF MEMS devices can be used as the control component in such systems.

However, current implementations of MEMS and MOEMS devices, such as RF MEMS switches, or SOAC approaches are limited by lack of cost-effective and reliable packaging methods to accommodate the enclosed devices and to merge with current world-wide fabrication capabilities. In recent years, costs of packaging and testing have dramatically increased from the norm of perhaps 10-20 percent of total cost, to 60-70 percent of total cost. Responses to this steady shift in costs from integrated circuit to packaging and testing have been slow to arrive. At the same time, demand is increasing to accommodate different domains, such as optical, microwave, or microfluidics simultaneously with electrical.

Nagarajan et al, in U.S. Pat. No. 6,846,725, disclose a specific method for packaging sensitive electronic devices. This method fails to meet the broad-based challenges inherent in device-level packaging in several respects. First, the method requires that the "device wafer" receive custom processing following end of normal fabrication procedures. In this method, two wafers are metallized and joined as an initial step. Subsequent steps relate to forming a through-substrate via and filling the via. This method is in stark contrast to the desired partitioning, where a device wafer is completed normally and immediately attached to a capping die or wafer. Second, the approach inherently assumes that vias will be formed through the entire normal thickness, typically 500-650 microns, of the capping die or wafer. Such approach is undesirable since the expense of forming through-substrate vias is roughly proportional to the depth of the via, but also because the lateral area consumed by such via increases in direct proportion to the thickness of the via. For example, assuming that a via fabricated in a substrate has a slope angle of 85 degrees, a via through a 500 micron thick substrate will etch laterally by about 44 microns. This means that, for a via that must be at least 2 microns in diameter, a space of (2*44+ 2)=90 microns is required. This method has the effect of dramatically restricting Input-Output (I/O) interconnect density. While this problem could in principle be solved by simply increasing the 85 degree angle to 90 degrees, such slope is extremely difficult to metallize uniformly, leading to difficulties in filling the vias with conductive metal. In addition, during fabrication some tolerance of the design angle must be anticipated in order to prevent population distributions including actual reentrant angles which are virtually impossible to cover with metal. Third, the defined approach does not anticipate optical, fluidic or thermal vias. Fourth, the approach does not define the capability to continue 3D stacking of die. Fifth, whereas conductive materials filling vias will often have a coefficient of thermal expansion (CTE) that is substantially higher than that of silicon, it is important to minimize the volume of material in the via in order to reduce stresses associated with this CTE mismatch. From this perspective, smaller vias are inherently more reliable. From these various problems, it is apparent that the method disclosed by Nagarajan et al is very limited in scope and that there is a need for a more universal solution accommodating a range of materials and functional domains.

The lifecycle of the development of a MEMS-based solution begins with the definition of the function to be required of the device. The device must be designed, modeled, and optimized while taking into consideration the materials used and the environmental conditions under which the device will operate. Before the device is fabricated, a packaging and interconnection scheme must be developed to provide for protection and for electrical connections to the system. The packaged device is tested, optimizations are made, and the design, modeling, fabrication, and packaging steps are repeated and refined until an acceptable product is ready for use. Testing may occur before the device has been packaged; but since the package almost always affects performance, it is necessary to perform tests after encapsulation to verify that the original specifications and requirements have not been compromised beyond acceptable levels. Finally, a manufacturing process must be developed for mass production. Due to the interdependency of each step upon the other, the entire system design must be considered at the inception of the design process rather than focusing on each aspect individually.

Choosing materials that are readily available and easily processed makes the task of high volume production easier, but these materials may not provide the performance needed for the device. Conversely, exotic or rarely used materials that provide excellent performance may prove problematic in bringing the device to market due to high cost of manufacturing, difficulties in processing, or poor throughput or yield. Therefore, finding new uses for existing materials with known and mature processing techniques is one of the most promising venues for increasing the development of new applications and market penetration of MEMS devices.

Whereas wirebonding interconnection has most frequently been the interconnect technology of choice, this technology is not extensible to 3D interconnections. So called flip-chip or solder bump interconnects is the leading favorite in these emerging applications, since many interconnections can be prepared in advance and formed simultaneously. In addition, solder reflow has the advantage of self-alignment due to "wicking action" of the solder. For a multiple-chip stack assembly, such self-alignment is extremely important to overcome misalignment tolerancing issues. Finally, wirebonding typically applies thermocompression with addition of ultrasonic scrubbing. Both temperature, compression and ultrasonic energy may be incompatible with the enclosed devices.

Through substrate vias (TSV) are a necessary element of 3D chip stacking techniques. As such, TSV is a primary enabling technology for 3D approaches. Whereas with some substrate materials, such as wire-in-glass, the TSV is readily provided, with typical substrate materials used in the microelectronics industry, the procedure will involve etching a patterned hole through the wafers, perhaps providing electrical insulation in the via, filling the vias with highly conductive material, and providing for attachment by solder bump or other method. For high I/O multiple wafer (die) interconnection, it will also be very important to provide for routing of the electrical connection through the entire stack. In addition, due to heat dissipation, it may be very important to allow for thermal management simultaneously with electrical connection. Finally, it is highly desirable to include provisions for optical and microfluidic TSV.

In many devices that operate at high frequencies, such as greater than 1 gigahertz, parasitic capacitance and inductance limit performance, while dielectric losses lead to reduction of transmitted signals. Devices which are interconnected primarily by wire bonds suffer from parasitics associated with the wire itself. For this reason, flip chip methods of die attachment are often preferred for high frequency devices. Conventional methods of incorporating the flip chip approach typically involve attachment of a device chip to a board. Such attachment accomplishes both electrical, mechanical and thermal attachment. Advantageously, interconnection lengths are short, resulting in reduced parasitic capacitance, inductance and resistance. However, thermal dissipation paths are constrained to be along solder bumps that are designed to provide optimum electrical and mechanical connections, with little consideration for thermal dissipation. In flexible vertically integrated systems, electrical, mechanical and thermal connections must all be optimized. Therefore, there is a need to extend the application of flip chip methods to accommodate all design variations.

For MEMS devices to be applied at high frequency, such as the RF MEMS switch, it is required to minimize parasitic capacitance and inductance but also to select materials with reliably low dielectric loss.

While a number of wafer-to-wafer bonding techniques have been made available, these techniques generally involve application of high temperature to achieve hermeticity. In addition, maintaining a hermetic environment over a long period of time requires that all materials have very low outgassing rates, and may require the inclusion of active getters. A need exists for an encapsulation method that maintains low cost, interconnection flexibility, and additionally allows for hermeticity and the incorporation of active getters.

It is common to be concerned about the yield of devices, since cost is directly impacted by yield. It is well known that by coupling a number of devices of unknown "goodness" into a system, the expectation is that the combined yield will suffer and costs will escalate. A successful fabrication strategy must be appropriately partitioned such that "known good die" (KGD) are assembled using highly reliable assembly procedures that do not result in further yield loss mechanisms. Typically, devices fabricated on a wafer are tested for functionally and at least some performance parameter prior to singulation. Once packaging steps are completed, devices are normally tested again to identify and sort out defects that have been introduced during the packaging steps themselves. Any new approaches to encapsulation and interconnection of devices must anticipate the requirements for testing of devices. For example, high frequency devices cannot be fully tested while in wafer form since the interconnections themselves become part of the circuitry. MEMS devices requiring high mechanical Q may not exhibit typical operating parameters unless they are enclosed in vacuum. Discrete devices may share a common substrate and cannot be accurately tested in wafer form since they are electrically connected. New methods must carefully consider and accommodate the needs for KGD and for device testing at the lowest point of assembly.

U.S. Pat. No. 6,846,725, issued 25 Jan. 2005, filed 27 Jan. 2003 (foreign application priority date 17 Oct. 2002), "Wafer-Level Packaging for MEMS", discloses a method for wafer-level packaging which includes forming electrical through-vias.

U.S. Pat. No. 6,638,784, issued 28 Oct. 2003, filed 24 Jun. 1999, protects "Hermetic Chip Scale Packaging Means and Method Including Self Test".

Analog Devices U.S. Pat. No. 6,534,340, issued 18 Mar. 2003, filed 18 Nov. 1998 protects "Cover Cap for semiconductor wafer devices". This patent envisions a wafer that is photoetchable or transparent to be attached as a cover to a substrate including a number of semiconductor devices.

U.S. Pat. No. 6,828,674, filed 5 Jun. 2002 and U.S. Pat. No. 6,441,481, filed 5 Jun. 2002, address "Hermetically Sealed Microstructure packages". A capping wafer is included. However, electrical connection is by wirebond following bonding of the two wafers, preferably with fritted glass, and wirebond is further encapsulated by an overmold.

U.S. Pat. No. 6,465,281, issued 15 Oct. 2002, filed 8 Sep. 2000, "Method of Manufacturing a Semiconductor Wafer Level Package", discloses a capping wafer bonded to a semiconductor wafer with fritted glass. No provision is made for electrical or optical through-vias.

U.S. Pat. No. 6,806,557, issued 19 Oct. 2004, filed 30 Sep. 2002, "Hermetically Sealed Microdevices having a Single Crystalline Silicon Getter for maintaining Vacuum", discloses a silicon capping wafer having a cavity and a roughened surface that performs as a getter.

U.S. Pat. No. 6,656,768, filed 8 Feb. 2001 and U.S. Pat. No. 6,507,082, filed 8 Feb. 2001, "Flip-Chip Assembly of Protected Micromechanical devices", protects low-cost ceramic packages, including BGA, by coating the IC surface with a protective material, selectively etching the coating for solder ball attachment, and singulating and flip-chip assembling.

U.S. Pat. No. 6,452,238, issued 17 Sep. 2002, filed 27 Sep. 2000, "MEMS Wafer Level Package", includes wafer level encapsulation, enclosing a device within a hermetic cavity formed by etching the capping wafer prior to attach.

US 2002/0090749, filed about January 2001, "Hermetic Package for MEMS Devices with Integrated Carrier", includes a capping wafer which may have features such as ports which allow MEMS devices to interact with the environment.

US 2002/0089044, filed about January 2001, "Hermetic MEMS Package with Interlocking Layers", complements the above patent filing.

US 2002/0113296, filed 31 Oct. 2001, "Wafer Level Hermetic Sealing Method", relates to a device that is hermetically sealed at wafer level. A capping wafer is attached using adhesives such as low melting point solder.

US 2003/0160310, filed 26 Feb. 2002, protects "Micromachined Semiconductor Package". Discussed is a hermetic multi-layered ceramic semiconductor package.

US 2003/0160021, filed 27 Feb. 2002, "Bonding for a MEMS and MEMS based devices", discloses a method of packaging MEMS devices which includes a Solid-Liquid interdiffusion process, comprised of layers of Chromium, Gold and Indium and resulting in a hermetic seal.

U.S. Pat. No. 5,193,738, issued 16 Mar. 1993, "Methods and apparatus for soldering without flux", includes inkjet solder application in inert ambient.

U.S. Pat. No. 6,114,187, issued 5 Sep. 2000, "Method for preparing a chip scale package and product produced by the method", discloses application of inkjet printing to apply solder as well as dielectric materials.

US 2004/0088855, filed 11 Nov. 2002, "Interposers for Chip-Scale Packages, Chip-Scale Packages including the interposers, test apparatus for effecting wafer-level testing of the chip-scale packages, and Methods". Describes interposer along with bumping and lateral redistribution. Limited to electrical interconnection and does not anticipate 3D stacking.

Reference is also made to the following documents: U.S. Pat. No. 7,019,408, 28 Mar. 2006, Bolken et al.; U.S. Pat. No. 6,235,554, 22 May 2001, Akram et al.; U.S. Pat. No. 6,107, 109, August 2000, Akram et al.; U.S. Pat. No. 6,097,087, August, 2000, Farnworth et al.; U.S. Pat. No. 6,020,629, February 2000, Farnworth et al.; T R. Anthony, "Forming electrical interconnections through semiconductor wafers", J. Appl. Phys., Vol. 52, No. 8, Aug. 1981, pp. 5340-5349; and "Chip Scale Review", Vol. 1, No. 1, May 1997.

From the problems discussed above, it is apparent that there is a need to provide an alternative to the encapsulation and interconnection of many devices that are fabricated in wafer form. A multi-functional capping chip solves various problems in encapsulation and interconnection of devices while simultaneously making provision for further vertical integration.

In view of the foregoing, the present invention is directed towards an improved device and method to enable stacking of semiconductor dice while simultaneously forming electrical, thermal, fluidic and optical interconnections.

With the exception of customization of termination metal on the semiconductor dice, a device must be constructed that allows for minimal changes in the semiconductor dice fabrication. Semiconductor dice fabrication is complex and expensive. To enable rapid implementation of chip-scale packages, the package must accommodate a variety of dice. The present invention is also directed to a device and method enabling improved packaging and interconnection of multiple semiconductor dice.

DISCLOSURE OF INVENTION

A multi-functional capping chip enables wafer-level packaging of devices in a manner that is compatible with 3D architecture. The capping chip is flexible to accommodate either land grid array or ball grid array interconnections between a previously fabricated chip and a second previously fabricated chip, printed circuit board, or other wiring board. The capping chip may incorporate recesses which can further accommodate MEMS or sensitive materials in an enclosed cavity.

A multi-functional capping chip accomplishes a generalized wafer-level and chip-scale packaging approach providing optical, electrical, fluidic and thermal through-substrate vias (TSV). The invention accommodates wafer-level packaging of a variety of devices including normal integrated circuit devices, but also devices including but not limited to biological or chemical sensors, optically active components, and Micro-Electro-Mechanical Systems. In this approach, a device wafer is fabricated in the normal manner. Since a device wafer normally includes top interconnect metallization, the inventive approach takes full advantage of such metallization for connection to a capping die. However, since it is important that such metallization be compatible with soldering, it may be required to modify the metallization materials on the device wafer. In addition, the design layout of the device wafer may be customized to the proposed process.

A multi-functional capping chip is fabricated by wafer-form batch processing techniques separately and independently from a device wafer. In this manner, the multi-functional capping wafer may optionally be diced on tape and prepared for pick-and-place attachment to a device wafer. During pick-and-place attachment a connection is completed between the device wafer and the multi-functional capping chip. Optionally, this connection may be by solder bump, in which case solder reflow may be accomplished simultaneously with pick-and-place attachment. Alternatively, attachment may be by adhesive such as epoxy.

By appropriate design, connections between multi-functional capping chip and device wafer may be optimized independently for electrical and thermal paths. For instance, a cluster of vias may act as a thermal conduit. In a preferred embodiment, optical vias may also be incorporated. Such vias may simply be openings penetrating the thickness of the multi-functional capping chip, may include optically transmissive materials which seal the openings, or may include optically active elements that are placed on the surface.

A multi-functional capping chip may be prepared by a number of methods, employing standard practices. In a preferred approach, a multi-functional capping chip wafer is initially thinned, followed by steps of forming vias, insulating, and filling of vias. Appropriate conductive interconnecting runners are included on the top surface of the multi-functional capping chip in order to distribute circuit signals. In this fashion, the multi-functional capping chip is flexible to accommodate a variety of interconnection requirements, including both land grid array and ball grid array approaches.

In accordance with the present invention an improved, infinitely stackable device and method are provided.

The stackable device comprises: a substrate having provision for many through-substrate vias; solder or electrically-conductive bumps to form interconnection between the substrate and a semiconductor dice; and a cavity to accommodate clearance for a second semiconductor dice on a subsequent layer of the stack.

BRIEF DESCRIPTION OF DRAWINGS

Embodiments of the invention are described hereinafter in detail with reference to the drawings, in which:

FIG. 11 is a summary of one method for constructing a capping chip.

FIG. 14B is an elevation view of the three layer stack. FIG. 14A is a plan view of the interconnection chip through the line A-A' of FIG. 14B.

BEST MODE FOR CARRYING OUT THE INVENTION

Embodiments of the invention are described hereinafter for addressing the foregoing need to provide an alternative to encapsulation and interconnection of electrical and optical devices.

Figure 1:
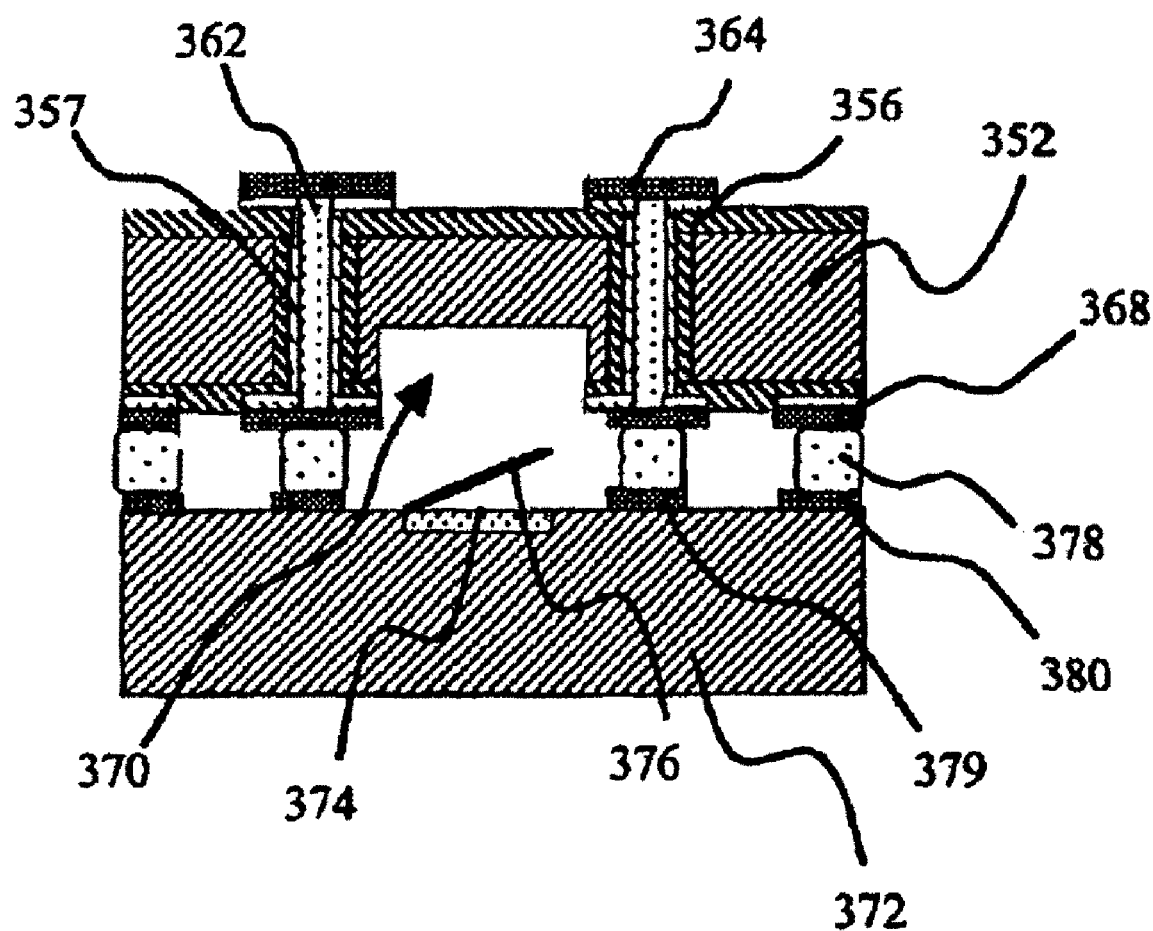
FIG. 1 provides an illustration of prior art wafer-level packages.

A prior art wafer-level package is described in FIG. 1, where a cap wafer 352 has through-wafer vias provided with barrier layers 356, 357. The through-wafer vias are filled with a conductive material 362 to form vertical interconnects. UBM layers are deposited on both sides of the cap wafer 352 and patterned to form interconnect pads 364, which are electrically interconnected via the conductive material 362, and bond pads 368 to facilitate bonding and stacking the cap wafer 352 with a wafer containing a MEMS device. The cap wafer 352 is solder bonded to a MEMS wafer 372 having a MEMS device 374 with a movable structure 376 using solder patterns 378 to form a wafer stack. Signals and electrical supply to the MEMS device 374 are conveyed to the MEMS device 374 via MEMS pads 379 formed on the MEMS wafer 372. Bond pads 380 formed on the MEMS wafer 372 are also congruent with and connected to the bond pads 368 formed on the cap wafer 352. The MEMS cavity 370 is congruent with the MEMS device 374 when superposed over the MEMS device 374 so that the movement of the movable structure 376 is unimpeded within the MEMS cavity 370.

Figure 2:
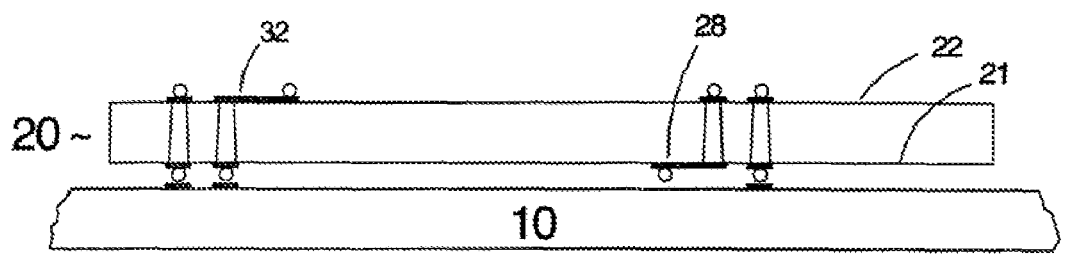
FIG. 2 provide an illustration of a multi-functional capping chip applied to an integrated circuit wafer.

In a first embodiment of the present invention, a multi-functional capping chip 20 is bonded to a device wafer 10 as shown in FIG. 2. A typical integrated circuit device wafer 10 may be connected by a multi-functional capping chip 20 to achieve redistribution of interconnection. This embodiment is advantageously employed when it is necessary to connect between two integrated circuit devices which do not have the same locations of bonding pads. Interconnection runners 28 on a first surface 21 of capping wafer 20 and interconnection runners 32 on a second surface 22 of multi-functional capping chip 20 are included to enable offsetting of bumps on first surface 21 from those on second surface 22.

Figure 3:
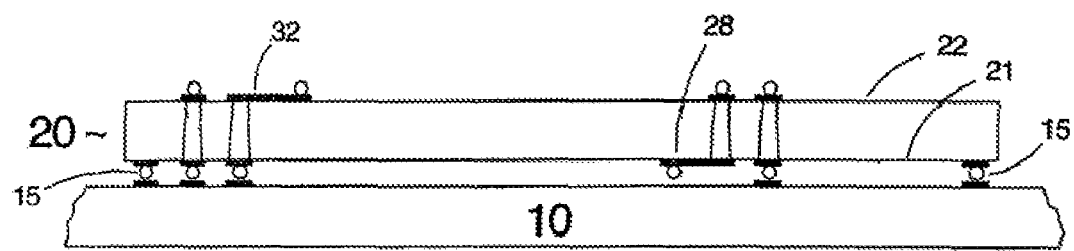
FIG. 3 provides an illustration of a multi-functional capping chip applied to an integrated circuit wafer including a sealing ring.

In a second embodiment of the invention, a multi-functional capping chip 20 is bonded to a device wafer 10 as shown in FIG. 3. A sealing ring 15 may be included in order to hermetically or non-hermetically seal the integrated circuit portion from the environment. As in the first embodiment, this embodiment is advantageously employed when it is necessary to connect between two integrated circuit devices which do not have the same locations of bonding pads. But additionally the first integrated circuit is protected by inclusion of sealing ring 15 with no increase in cost or complexity.

Figure 4:
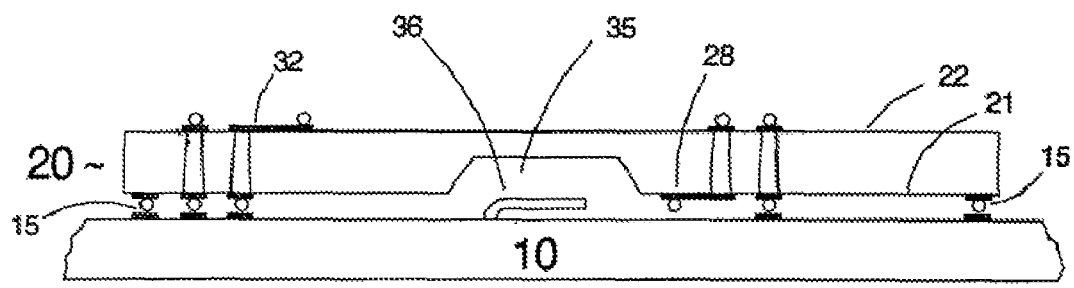
FIG. 4 illustrates a multi-functional capping chip applied to enclose a MEMS device in a hermetic fashion including as sealing ring.

In a third embodiment of the invention, a multi-functional capping chip is bonded to an integrated circuit device wafer as shown in FIG. 4. A cavity 35 is included in order to provide appropriate relief for a moveable device, or to enclose biological, chemical or other materials. A sealing ring 15 may be included in order to hermetically or non-hermetically seal the integrated circuit portion from the environment. As in the first embodiment, this embodiment is advantageously employed when it is necessary to connect between two integrated circuit devices which do not have the same locations of bonding pads. The embodiment provides for an additional advantage when it is important to protect a moveable device or sensitive component 36 that is fabricated primarily on the device wafers.

Figure 5:
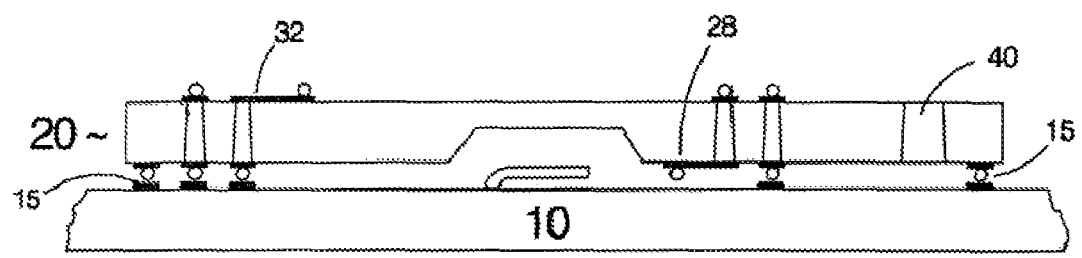
FIG. 5 illustrates a multi-functional capping chip applied to an integrated circuit wafer or MEMS device, including an optical through via.

In a fourth embodiment of the invention, a multi-functional capping chip 20 is bonded to a device wafer 10 as shown in FIG. 5. A cavity 35 is included in order to provide appropriate relief for a moveable device, or to enclose biological, chemical or other materials. A sealing ring 15 may be included in order to hermetically or non-hermetically seal the integrated circuit portion from the environment. An optical or fluidic via 40 is also included in order to provide a path for light rays or fluid originating above multi-functional capping chip 20 to penetrate to the underlying integrated circuit device wafer 10. In addition, light rays or fluid originating from integrated circuit device wafer 10 may be allowed to penetrate the multi-functional capping chip 20. As in the first embodiment, this embodiment is advantageously employed when it is necessary to connect between two integrated circuit devices which do not have the same locations of bonding pads. The embodiment provides for an additional advantage when it is important to protect a moveable device or sensitive component 36 that is fabricated primarily on the device wafers.

Figure 6:
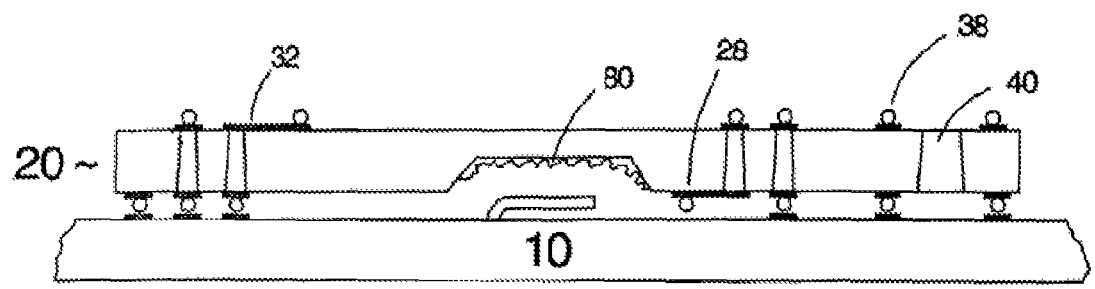
FIG. 6 illustrates a multi-functional capping chip applied to an integrated circuit or MEMS device wafer, including an optical through via and active getter materials.

In a fifth embodiment of the invention, a multifunctional capping chip 20 is bonded to a device wafer 10 as shown in FIG. 6. As in the fourth embodiment, a cavity 35 is included in order to provide appropriate relief for a moveable device or sensitive component 36, or to enclose biological, chemical or other materials; a sealing ring 15 may be included in order to hermetically or non-hermetically seal the integrated circuit portion from the environment; an optical or fluidic via 40 is included; and active gettering material 80 is also enclosed within cavity 35. In the event that a fluidic connection is desired, an additional sealing ring 38 is included to provide hermetic seal around optical and fluidic via 40.

Figure 7:
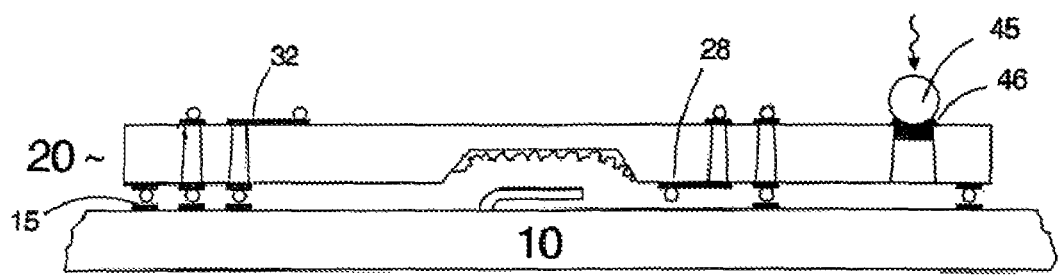
FIG. 7 illustrates a multi-functional capping chip applied to an integrated circuit wafer or MEMS device, including an optical through via with associated optical element, and a sealing ring together completing a hermeticity requirement.

In a sixth embodiment of the invention, a multi-functional capping chip 20 is bonded to a device wafer 10 as shown in FIG. 7. As in the previous embodiments, a cavity 35 is included in order to provide appropriate relief for a moveable device, or to enclose biological, chemical or other materials; a sealing ring 15 may be included in order to hermetically seal the integrated circuit portion from the environment; an optical or fluidic via 40 is included; and active gettering materials 80 are also enclosed within cavity 35. In addition, optical element 45 is included in order to both control the direction and behavior of light rays passing through the multi-functional capping chip 20 and to hermetically seal optical and fluidic via 40. Optical element 45 may optionally be attached by adhesive layer 46.

Figure 8:
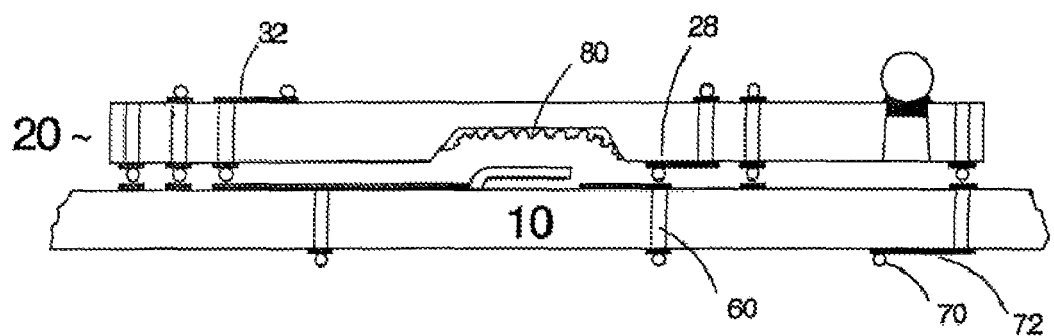
FIG. 8 illustrates a multi-functional capping chip applied to an integrated circuit wafer or MEMS device wafer which has been fully prepared for through wafer vias.

In a seventh embodiment of the invention, a multi-functional capping chip 20 is bonded to a device wafer 10 as shown in FIG. 8. As in the previous embodiments, a cavity 35 is included in order to provide appropriate relief for a moveable device, or to enclose biological, chemical or other materials; a sealing ring 15 may optionally be included in order to hermetically seal integrated circuit portion from the environment; an optical or fluidic via 40 is included; and active gettering materials 80 may optionally be enclosed within cavity 35. In addition, optical element 45 may be included in order to both control the direction and behavior of light rays passing through the multi-functional capping chip and to hermetically seal optical and fluidic via 40. In this embodiment, device wafer 10 is further prepared to have through substrate vias. Through substrate vias 60 are prepared, along with backside interconnection runners 72 and solder bumps 70. This embodiment is advantageously employed when it is necessary to connect a number of vertically stacked units. As will be readily apparent to those skilled in the arts, once a single unit is prepared having flexibly located bump connections on both top and bottom surfaces, then multiple units may be prepared and stacked atop each other without limitation. Of course, it is understood that due consideration must be given to design parameters such as heat dissipation or operating frequency, and to practical considerations such as yield and overall cost.

Figure 9:
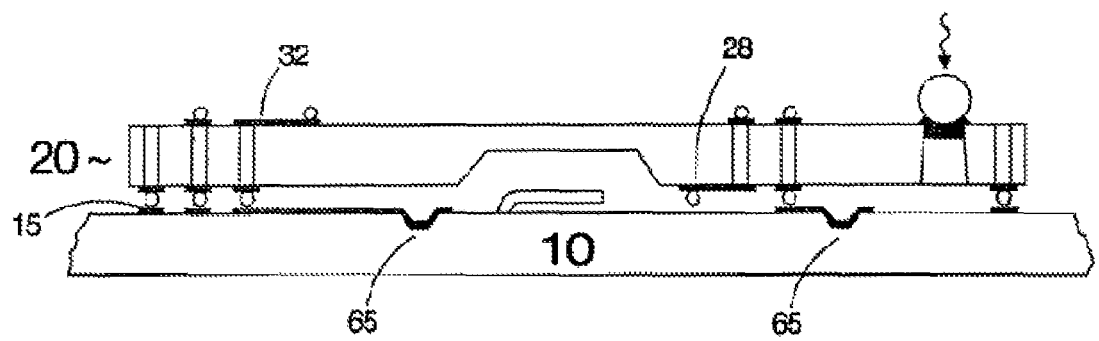
FIG. 9 illustrates a multi-functional capping chip applied to an integrated circuit or MEMS device wafer which has been prepared for through wafer vias following etchback to thin the device wafer.
Figure 10:
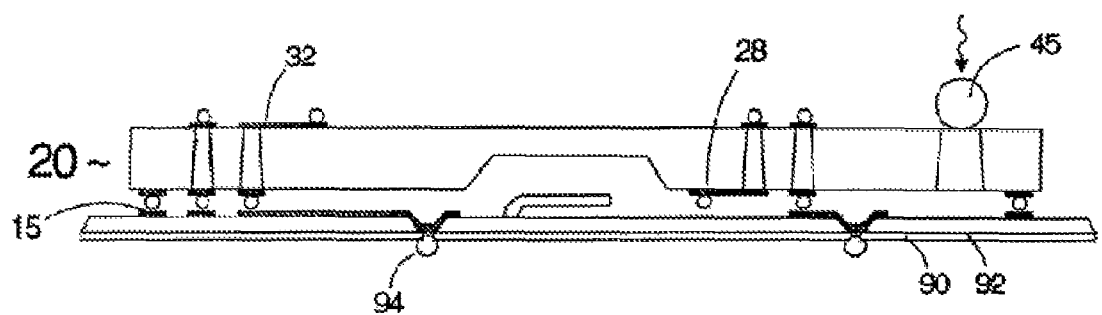
FIG. 10 illustrates the completed unit as in FIG. 9 following completion of etchback to thin the device wafer.

In an eighth embodiment of the invention, a multi-functional capping chip 20 is bonded to a device wafer 10 as shown in FIG. 9. This embodiment is similar to the seventh embodiment, with through substrate vias 65 being prepared only partially through device wafer 10 at the moment of attachment to the multi-functional capping chip 20. Subsequent to the attachment, device wafer 10 may be thinned from the backside to reveal the partially prepared through substrate vias 65. Insulating layer 90 may optionally be deposited on surface 92 of device wafer 10 prior to addition of bumps 94 as shown in FIG. 10. As in the previous embodiment, the unit so constructed may now be employed in a vertical stack with similarly prepared units.

By these embodiments, a multi-functional capping chip 20 having broad applicability is demonstrated. The flexibility to apply various embodiments of the invention gives a designer the tools necessary to respond to a number of limitations that have been identified with current technology. In embodiments one through six described above, no custom fabrication is required on the device wafer, with the exception of a metal layer that is compatible with the bumps applied. Since virtually every device that is fabricated in wafer form already requires a metal layer for interconnection, then the necessity of customizing the pattern and metallurgy of this wafer constitutes a minor inconvenience. In addition, the application and patterning of metal on a device wafer is typically one of the last steps completed during fabrication. Therefore, investment in customizing metal layers is minimal.

In embodiments seven and eight above, significant customization of the device wafer is required. However, these embodiments will be important when it is desired to minimize total system volume, as the approach is a primary enabler for 3D stacking of various functional units.

It will be recognized by those skilled in the arts that several methods may be applied in the construction of an multi-functional capping chip, depending oh the specific desired end result. For illustration purposes, a single method of construction will be outlined. It should be understood that the invention is not limited to this method.

As summarized in FIG. 11, an method for developing one embodiment of the invention is described for construction of a multi-functional capping chip including a cavity. A silicon starting wafer is thinned in Step 201 to the target value of perhaps 25-100 microns. For convenience, the silicon starting wafer will be chosen to be high resistivity, for example greater than about 1,000 ohm-cm. In this fashion, any metal contacting the silicon will make a poor contact, such as a Schottky diode contact. At this point, an insulating layer is prepared on both surfaces of the wafer. In a preferred method, such insulating layers are prepared by thermal oxidation in Step 202. Following thermal oxidation, the silicon wafer is attached to a temporary support substrate by means of an adhesion layer in Step 203. Such adhesion layer may optionally be a metal that is easily etched, or a polymer such as a thermoplastic material. In either case, it is required that any materials subsequently deposited are unaffected by the etchant for the chosen adhesion layer. For example, said adhesion layer may be of sputter deposited Titanium, which is known to etch very rapidly in hydrofluoric acid. Therefore, any metals or insulators applied to the multi-functional capping chip during construction must be tolerant of exposure to hydrofluoric acid. Optionally, the temporary support substrate may be prepared with an array of through holes prior to attachment, in order to minimize the exposure time required to separate the multi-functional capping chip from the temporary support substrate following planned processing steps.

The thinned multifunctional capping chip substrate is now in a stable format allowing for subsequent fabrication. A metal interconnect layer may be deposited, patterned and etched using conventional techniques in Step 204. A pattern may be applied and insulator material etched to remove over all subsequent vias as well as the future location of a cavity in Step 205. A pattern may be applied to delineate planned vias, followed by reactive ion etch to form through holes in Step 206. As is well known to those skilled in the arts, such reactive ion etch can controllably result in holes having slight sidewall taper (for instance, 84-88 degrees) as long as the aspect ratio of the completed hole does not exceed approximately 20. For a patterned hole diameter of 10 microns, a sidewall angle of 88 degrees, and a wafer thickness of 100 microns, the hole diameter penetrating on the opposite surface of the wafer is about 3 microns. As will be appreciated by those skilled in the arts, holes of this approximate size may be spaced apart from one another by 25 microns or less.

Following completion of etching holes for vias and prior to removal of the masking photoresist layer, an etch to remove insulating material in the bottom of the hole (on the opposite side of the wafer) will be applied. Next, and again prior to removal of the masking photoresist layer, silicon dioxide or other insulating layer may optionally be applied along sidewalls of the holes in Step 207. Insulating material applied to the field along the top planar surface may be removed by the liftoff procedure in Step 208 when photoresist is dissolved. A lining metal layer that is compatible with solder and resists reactive ion etch can now be deposited, patterned and etched in Step 209. For example, such lining metal layer may consist of chrome for adhesion, following by copper, with a thin capping layer of gold. Insulating layer may be deposited, for example, by PECVD method, while lining metal layer may be deposited by sputter deposition. It is advantageous to contrive for lining metal layer to overlap the previously applied and patterned metal interconnect layer. In one alternative, vias may be overfilled with conductive material, for example sputtered copper, and chemical-mechanical polish can be applied to planarize the surface, removing excess copper.

A reaction ion etch step may now proceed from the top surface to form a cavity in the silicon in Step 210. At this point, the top surface is entirely covered by either insulator material (for instance, silicon dioxide) or metal, with the exception of the region where the cavity is to be formed. In this region, bare silicon is exposed. As a cavity region is many microns in lateral extent, while required depth of cavity is perhaps only 2-10 microns, then the aspect ratio of the cavity is much less than one. In this case, very low ion energies can be applied during reactive ion etch, maintaining conditions such that sputtering of insulator or metal films from the surface will be minimized.

At this point, the temporary support substrate may be removed by dissolution of the adhesion layer. Optionally, the wafer may be inverted and remounted to a temporary support substrate in Step 211. Metal may be applied to the opposite surface, patterned and etched in such a manner as to provide interconnection between vias in Step 212. The multi-functional capping chip is now prepared for final assembly in Step 213 by demounting, dicing on tape and pick-and-place.

Device wafer is prepared for attachment to multi-functional capping chip by inkjet printing solder balls onto appropriate pads, using a non-contact method. In the case where a sealing ring is desired, sufficient solder may be inkjet printed to enable full reflow. Optionally, all inkjet printing is performed under a controlled, inert ambient in order to prevent oxidation of the solder. For example of such method, U.S. Pat. No. 5,193,738 describes methods of applying solder under inert ambient. Pick-and place of multi-functional capping chip from tape to the device wafer is next completed. The device wafer may be held over a heated mandrel in order to complete solder reflow simultaneous with placement of multi-functional capping chip onto a device wafer. Once a given multi-functional capping chip is placed, the device wafer will be indexed to remove this location from the high temperature point of the mandrel. In this manner, the device wafer can be fully populated with a number of multi-functional capping chip.

Following completion of pick-and-place and solder reflow of multi-functional capping chip, inkjet printing can be applied to add solder to the top surfaces of the multi-functional capping chip. A combination of inkjet printing and robotic pick-and-place may be applied to seal optical vias with optically transmissive material, or to add discrete optical elements covering optical vias. Optionally, a whole-wafer reflow heating step may be applied in order to flow solder uniformly into via holes. It should be noted that a key enabler for such reflow is a small diameter via. For example, if a via is of 100 micron diameter and an inkjet printer solder ball is 25 micron diameter, then the solder ball will not be controllably and reproducibly placed, since it may simply fall into the via hole. However, if the via diameter is 10 microns, the same 25 micron solder ball will fit over the via hole opening, and upon reflow will be drawn into (wicking action) the via hole, hermetically sealing the hole.

Following full attachment, placement of solder balls and optical materials and elements, wafer form testing may optionally be performed, following by dicing to singulate the units.

According to embodiment eight above, device wafer may optionally be thinned to reveal partially etched vias prior to dicing to singulate the units.

Although only a single method of fabricating the several embodiments of the invention has been disclosed, it will be apparent to one skilled in the art in view of this disclosure that numerous changes and/or modifications can be made without departing from the scope and spirit of the invention.

As will be apparent to those skilled in the arts, a thermal conduit can be constructed by appropriate placement of several through-substrate vias. Multiple paths are provided for heat flow. The inventive device is flexible to allow for placement of through-substrate vias on demand. In addition, it is well known that at high frequencies, electrical waves tend to travel along the skin of a conductor. As such, an electrical via for high frequency waves can best be provided with a multiplicity of through-substrate vias. Again, the inventive device provides the necessary flexibility.

An alternative device may be constructed by the LTCC method. In this case, the features required on a multi-functional capping chip can be provided by standard methods. For instance, a cavity may be formed by punching out the design area on multiple successive layers. Through substrate vias are readily formed as a portion of the LTCC construction. Interconnect metal layers accomplishing redistribution are an integral part of the LTCC approach. Once an LTCC wafer fabrication is completed, the wafer may be diced. The device wafer is again prepared for assembly by wafer form inkjet printing of solder. Once LTCC die are singulated and placed, inkjet printing may again be applied to the top surface in order to provide bumps for further 3D assembly.

Optical and fluidic interconnections may be formed according to the demands of the particular application. Vias are patterned and etch simultaneously with electrical and thermal vias. For hermetic applications, a solder ring may be printed surrounding each optical and fluidic via.

Figure 12:
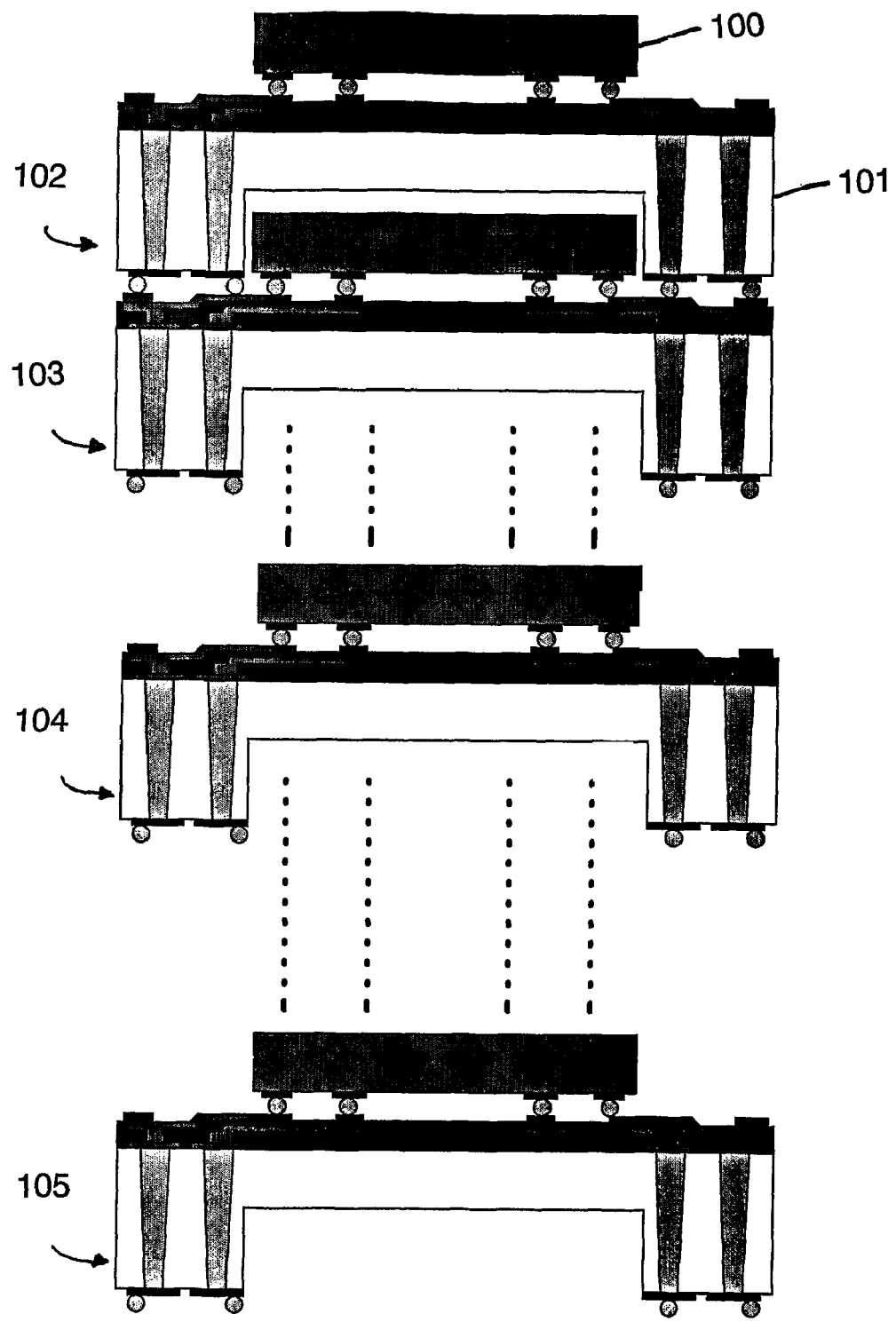
FIG. 12 is a side view illustrating the nesting of multiple device chips into interconnection chip, resulting in a stack of unlimited number of units in accordance with the invention.
Figure 13:
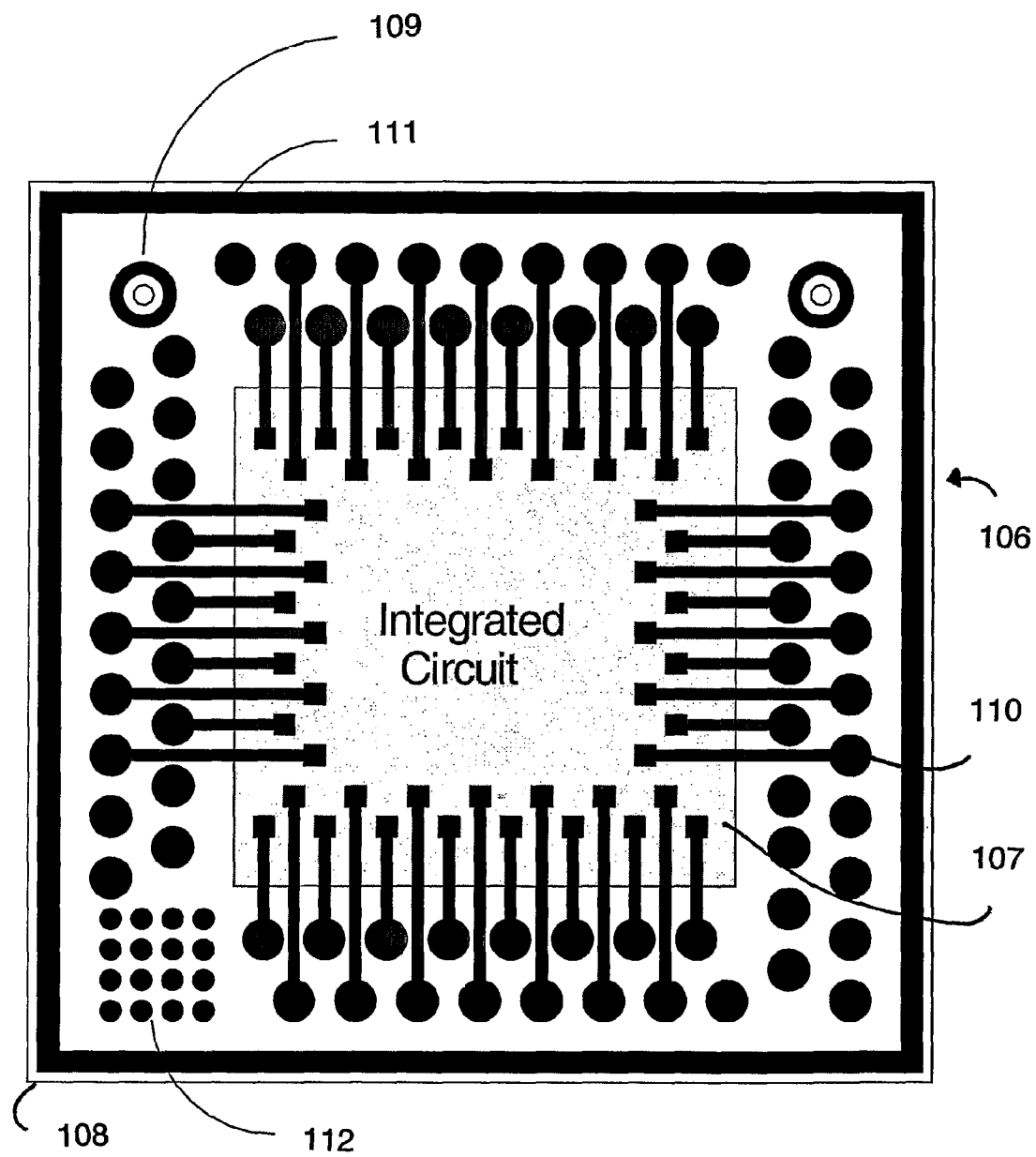
FIG. 13 is a plan view of a single unit, illustrating an Integrated Circuit chip placed atop an interconnection chip having optical/fluidic through substrate connections, as well as electrical connections and a thermal interconnect array.

With respect to FIGS. 12-14, an infinitely stackable device and method are described.

A TSV substrate is purchased. Preferably, the substrate may be thinned to less than 100 microns and in a preferred embodiment will be about 50 microns thick. Fabrication costs related to forming TSVs are substantially reduced in a thinner wafer, as through-substrate etching equipment times scale roughly with starting substrate thickness. On the other hand, special fabrication techniques are required to enable fabrication on such a thin substrate.

Initially, dielectric material is deposited on both sides of the substrate. The dielectric materials are chosen to enable simultaneous etching of silicon and dielectric during subsequent Deep Reactive Ion etch (DRIE). For example, silicon nitride is a well known dielectric having this property. Metal may be applied to a first side of the substrate, and optionally to a second side of the substrate. At this point, the thin substrate is temporarily attached to a support substrate using an adhesive that can tolerate temperatures as high as 210 C. Special materials are available to allow for attachment and detachment. An important aspect of such materials is thermal stability to temperatures of at least 200 C.

Applying photolithography and DRIE techniques, via holes are formed in the substrate. It should be understood that both top and bottom dielectrics are simultaneously etched along with the substrate.

A liner dielectric is formed in the via by the method of depositing a highly conformable dielectric, for example PEVCD silicon dioxide; then performing reactive ion etch (RIE) to anisotropically remove the conformable dielectric layer. In this fashion, only the vertical sidewalls of the via will retain a dielectric coating.

The next step is to wholly or partially fill the vias with conductive material. This can be accomplished, for example, by sputter deposition of an adhesion layer such as titanium or tantalum nitride, followed by copper. It is extremely difficult to completely fill vias with a sputter deposition alone, given the general lack of conformality of sputter deposited layers. Therefore, the sputter deposition may be followed with electroplating of various conductive materials to wholly or partially fill the vias. The sputter deposited metals may double as top surface interconnect metal. In this case, photolithography and etch steps may be applied to pattern the metal. Optionally, the via fill may be supplemented by inkjet printing of solder or other conductive materials into the vias. In general, combinations of various methods such as sputtering, electroless deposition, electroplating, chemical vapor deposition, and inkjet printing. Advantage may be taken of the conductive material for via filling to provide conductive traces on the top surface of the substrate. A requirement is that such conductive traces be in electrical communication with the conductive material in the vias. Such conductive traces may be formed by photolithography and etch techniques as required.

At this point, the substrate may be demounted, inverted and remounted to allow for fabrication on a second surface. Such fabrication may include patterning of the previously deposited metal using photolithography and etch techniques, as well as application of supplemental interconnect materials as desired.

A cavity may be etched in the second surface of the substrate at this point. For example, photolithography and DRIE techniques may be applied to provide for a cavity. The depth of the cavity may vary to accommodate design variations. In a preferred embodiment, the cavity depth will be about 25-50 microns, or about half of the substrate thickness. As is well known in the art, semiconductor dice can be routinely thinned to about 25-50 microns and subsequently singulated and packaged. Therefore, the planned cavity depth will generally provide clearance for a typical, state-of-the-art semiconductor dice.

As is also well known in the art, additional interconnect layers may be applied on either the top or bottom surface of the interconnect device in order to provide for flexibility in routing. For example, such multi-level interconnection involves application of an insulating layer; planarizing the surface by chemical mechanical polishing or other method; forming of vias through the deposited insulating layer; filling of vias with conductive material; and application and patterning of top surface conductive material. Semiconductor manufacturers routinely practice such multi-level interconnection fabrication techniques.

In packaging as shown in FIG. 12, a semiconductor dice 100 previously thinned to about 25-50 microns is flip-chip bonded to the prepared interconnect device 101 to form a completed unit 102. The interconnect device 101 is specifically designed for matching the electrical, optical, thermal and fluidic interconnections on the semiconductor dice 100. As is well known in the art, there are various methods for accomplishing such flip-chip interconnection, generally including at least solder and conductive epoxy adhesion materials. A second unit 103 may be prepared in a similar fashion. At this point, the two units may be fully interconnected by stacking and bonding them together. A third unit 104, similarly prepared, may be subsequently bonded, a fourth unit 105 may be bonded, and so on. The number of units stacked in this fashion is limited only by cost and design considerations, as opposed to fabrication technique.

In the case where solder is applied as the interconnection material, it is undesirable to melt the solder multiple times. Therefore, a general approach is to physically stack multiple layers of interconnection devices including flip-chip attached semiconductor dice, and to simultaneously reflow the interconnecting solder.

Vias may be formed in the substrate by a variety of methods. This includes at least laser machining, wet anisotropic etching, and dry anisotropic etching. In an exemplary fabrication method, vias are formed by DRIE. Equipment and process capabilities are readily available to support such via formation. The method allows for some adjustment of slope, with the most desirable slope being 84-87 degrees relative to the plane of the top surface of the substrate. Such angle is chosen to both minimize the layout area required for a via and accommodate the requirement for adequate coverage of conductive material along the vertical surface.

The substrate material can be chosen from a family of well-known materials, such as silicon, germanium, gallium arsenide, ceramic, glass or other etchable materials. The substrate material must either be electrically insulating, or a convenient choice of added surface insulating material must be available. In a preferred embodiment, the substrate material is silicon, due to fortuitous combination of properties, such as etchability, thermal conductivity, and ability to adjust electrical conductivity to suit. Both silicon dioxide and silicon nitride are readily available surface insulating materials.

As shown in FIG. 13, a single unit 106 may comprise an Integrated Circuit chip 107 placed atop an interconnection chip 108 having optical/fluidic through substrate connections 109, as well as electrical connections 110, a sealing ring 111 and a thermal interconnect array 112.

Figure 14B:
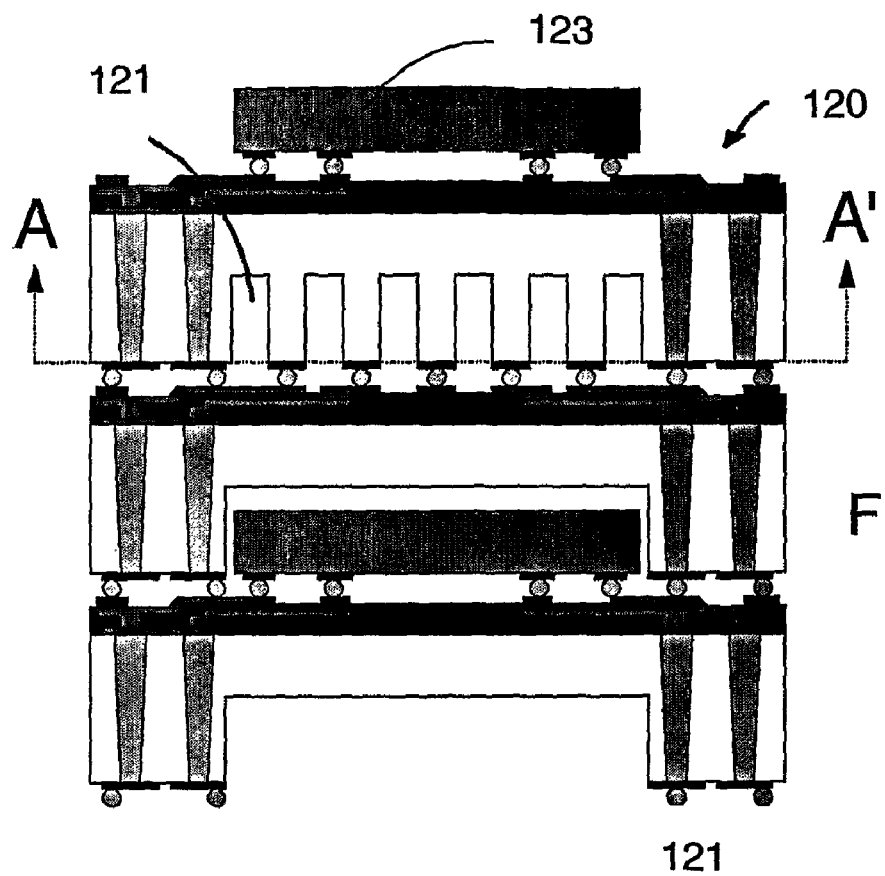
FIGS. 14A and 14B illustrate a three layer stack containing an interconnection chip that has been customized by adding serpentine fluid channels connecting to sealed interconnect feedthroughs.
Figure 14A:
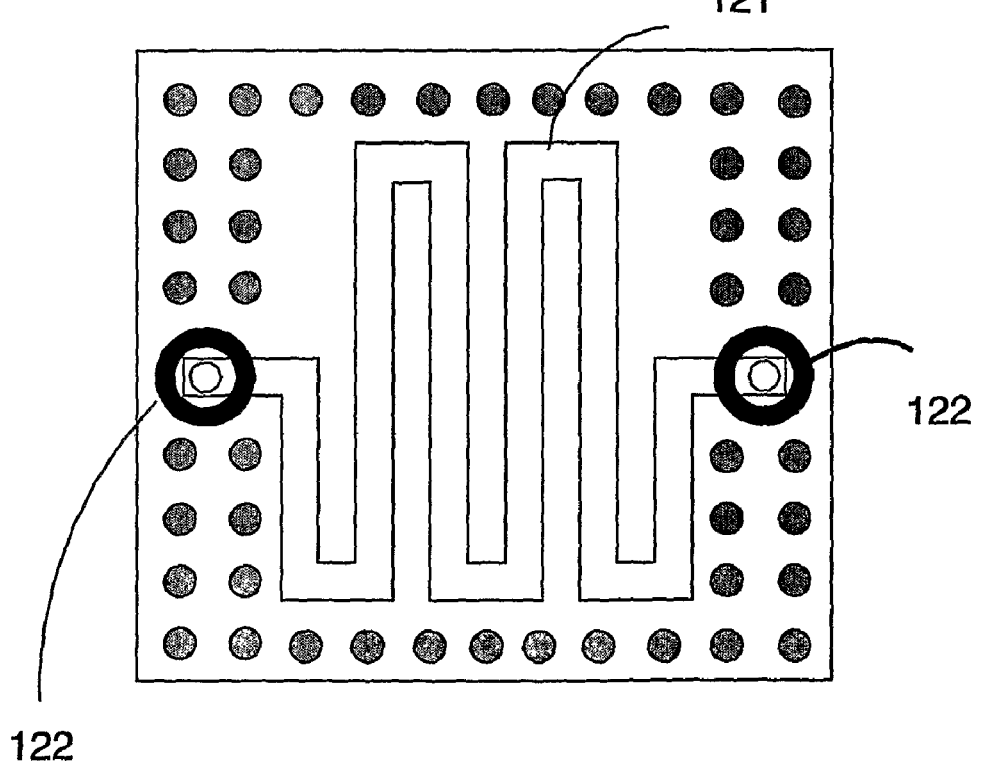

FIGS. 14A and 14B illustrate a three layer stack containing a semiconductor die 123 on an interconnect chip 120 that has been customized by adding serpentine fluid channels 121 connecting to sealed interconnect feedthroughs 122.

Optionally, testing of each packaged subsystem can be performed prior to completion of stacking.

INDUSTRIAL APPLICABILITY

Several problems are uniquely solved with the inventive approach. A generalized solution for wafer-level and chip-scale packaging of sensitive MEMS, chemical and biological materials is demonstrated. Prior art shows only a single method of fabricating a capping wafer including cavities. These approaches do not allow for redistribution of interconnect on the capping wafer (with exception of US 2004/0088855, which shows limited redistribution on one side of the capping chip). Such redistribution can be on both top-side and bottom-side of the capping chip. In addition, by accomplishing solder placement in wafer form by a simple additive step (inkjet printing), broader flexibility in defining interconnections is enabled. By completing inkjet printing in an inert atmosphere, mating the solder joints and reflowing in same ambient, it is anticipated that need for flux and associated messy cleanups can be entirely eliminated. Provision is made for a thinned substrate for capping chip to be used, which importantly allows for much higher density of interconnection. Provision is also made for gettering material to be included in the formed cavity. The disclosed capping chip enables electrical interconnection, but also thermal, fluidic and optical interconnections. Additionally, the solder application method results in hermetic seals at the edges between the capping chip and the die.

Finally, the present invention anticipates 3D stacking of many layers, allowing for very high complexity systems to be built around the multi-functional capping chip concept.

An infinitely stackable chip scale package including capability for electrical, thermal, optical, and fluidic interconnections to various layers is provided. Each common design element may be customized to provide both the required die attachment and multi-domain interconnection. Through-substrate vias in the interconnect device are filled to enable electrical and thermal connection or optionally hermetically sealed relative to other surfaces to enable fluidic or optical connection. Optionally, optical components may be placed within the via region in order to manipulate optical signals. Redistribution of electrical interconnection is accomplished on both top and bottom surfaces of the interconnect chip. The method for fabricating the interconnect device includes the steps of: forming, insulating, and at least partially filling vias with conductive material; connecting vias to conductive traces on a top surface of the interconnect chip; connecting vias to conductive traces on a bottom surface of the interconnect chip; providing bump regions for electrical and mechanical interconnection to a subsequent interconnect device; and forming recessed regions to accommodate a subsequent die in a stack. The method simultaneously accomplishing interconnection and packaging of multiple semiconductor die to form a system.

The invention claimed is:

1. A method for fabricating an infinitely stackable interconnect device, the method comprising:
   forming a substrate from a single wafer having a first surface and an opposing second surface;
   forming a recessed region in the substrate sized to accommodate at least one die in a stack;
   forming at least one via in the substrate passing from the first surface to the opposing second surface;
   at least partially filling the via with conductive material to form a conductive via;
   forming at least one first interconnection pad on the first surface in electrical communication with the conductive via;
   forming at least one second interconnection pad on the second surface in electrical communication with the conductive via;
   forming at least one redistribution trace at one of said first and second surfaces of said substrate and in communication with at least one of said first and second interconnection pads;
   mounting a die to the substrate in electrical communication with the first or second interconnection pad to form a packaged subsystem;
   singulating the packaged subsystem by dicing and;
   mounting the packaged subsystem to at least one subsequent packaged subsystem to form a stack.

2. The method of claim 1, further comprising providing at least one via for thermal interconnection between the first surface and the second surface.

3. The method of claim 1, wherein the substrate thickness is about 50-100 microns and the recessed region thickness is about 25-50 microns.

4. The method of claim 1, further comprising the step of forming at least one redistribution trace at one of said surfaces of said substrate and in communication with at least one of said interconnection pads.

5. The method of claim 1, further comprising forming a mechanical seal between the die and the substrate.

6. The method of claim 5, wherein the mechanical seal is a sealing ring.

7. The method of claim 1, wherein the substrate comprises a semiconductive material.

8. The method of claim 1, wherein the substrate comprises an insulative material.

9. The method of claim 1, further comprising providing a conductive plug positioned at the via.

10. An infinitely stackable interconnect device having interconnections for stacking the device with a subsequent device to form a stack, the device comprising:
- a substrate having a first surface and an opposing second surface;
- a recessed region in the substrate sized to accommodate at least one subsequent die in a stack;
- at least one conductive via in the substrate passing from the first surface to the opposing second surface;
- at least one first interconnection pad on said first surface in electrical communication with said conductive via;
- at least one second interconnection pad on said opposing second surface in electrical communication with said conductive via;
- at least one via for thermal interconnection between the first surface and the opposing second surface; and
- means for electrical connection between at least one of said first interconnection pad and said second interconnection pad to at least one subsequent die;
- wherein said subsequent die is mounted to said substrate in electrical communication with at least one of said first interconnection pad and said second interconnection pad.

11. The device of claim 10, wherein the substrate thickness is about 50-100 microns and the recessed region thickness is about 25-50 microns.

12. The device of claim 10, further comprising at least one redistribution trace at one of said surfaces of said substrate and in communication with at least one of said interconnection pads.

13. The device of claim 10, wherein said conductive via has a sidewall taper in the range of about 84 degrees to 88 degrees.

14. The device of claim 10, wherein said substrate comprises silicon.

* * * * *

UNITED STATES PATENT AND TRADEMARK OFFICE
CERTIFICATE OF CORRECTION

| | | |
|---|---|---|
| PATENT NO. | : 7,897,503 B2 | Page 1 of 1 |
| APPLICATION NO. | : 11/920308 | |
| DATED | : March 1, 2011 | |
| INVENTOR(S) | : Ron B. Foster, Ajay P. Malshe and Matthew W. Kelly | |

It is certified that error appears in the above-identified patent and that said Letters Patent is hereby corrected as shown below:

Column 1:

Before the "Technical Field" section, please insert the following paragraph:

-- This invention was made with government support under contract nos. USAF/AFRL/AFOSR F49620-02-1-0239 and USAF/AFRL/SNDI F33615-00-D-1726-003 with the United States Air Force. The government has certain rights in this invention. --

Signed and Sealed this
Thirteenth Day of March, 2012

David J. Kappos
*Director of the United States Patent and Trademark Office*